(12) United States Patent
Lee et al.

(10) Patent No.: US 12,139,397 B2
(45) Date of Patent: Nov. 12, 2024

(54) SELECTIVE SELF-ASSEMBLED MONOLAYER PATTERNING WITH SACRIFICIAL LAYER FOR DEVICES

(71) Applicant: INVENSENSE, INC., San Jose, CA (US)

(72) Inventors: Daesung Lee, San Jose, CA (US); Alan Cuthbertson, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 81 days.

(21) Appl. No.: 17/028,552

(22) Filed: Sep. 22, 2020

(65) Prior Publication Data

US 2021/0107785 A1 Apr. 15, 2021

Related U.S. Application Data

(60) Provisional application No. 62/915,195, filed on Oct. 15, 2019.

(51) Int. Cl.
  *B81B 7/00* (2006.01)
  *B81B 3/00* (2006.01)
  (Continued)

(52) U.S. Cl.
  CPC ............ *B81B 7/008* (2013.01); *B81B 3/0005* (2013.01); *B81C 1/00238* (2013.01); *G01C 19/5712* (2013.01); *G01P 1/00* (2013.01); *G01P 15/08* (2013.01); *B81B 2201/0235* (2013.01); *B81B 2201/0242* (2013.01); *B81C 2201/112* (2013.01)

(58) Field of Classification Search
  CPC .......... B81B 3/0005; B81B 2201/0235; B81B 2201/0242; B81B 3/001; G01P 2015/0871; G01P 2015/0874; B81C 1/00912–00992; B81C 2201/11–112
  See application file for complete search history.

(56) References Cited

U.S. PATENT DOCUMENTS

| | | | |
|---|---|---|---|
| 2014/0239353 A1* | 8/2014 | Daneman | B81C 1/00158 438/51 |
| 2016/0185592 A1* | 6/2016 | Hsieh | B81B 3/0005 118/723 R |

(Continued)

OTHER PUBLICATIONS

Jing et al., "Cell patterning using molecular vapor deposition of self-assembled monolayers and lift-off technique", Acta Biomaterialia, 7 (2011) pp. 1094-1103. (Year: 2010).*

Primary Examiner — Shahed Ahmed
Assistant Examiner — Sun Mi Kim King
(74) Attorney, Agent, or Firm — Amin, Turocy & Watson, LLP

(57) ABSTRACT

Selective self-assembled monolayer patterning with sacrificial layer for devices is provided herein. A sensor device can include a handle layer and a device layer that comprises a first side and a second side. First portions of the first side are operatively connected to defined portions of the handle layer. At least one area of the second side comprises an anti-stiction area formed with an anti-stiction coating. The device can also include a Complementary Metal-Oxide-Semiconductor (CMOS) wafer operatively connected to second portions of the second side of the device layer. The CMOS wafer comprises at least one bump stop. The anti-stiction area faces the at least one bump stop.

7 Claims, 14 Drawing Sheets

(51) Int. Cl.
*B81C 1/00* (2006.01)
*G01C 19/5712* (2012.01)
*G01P 1/00* (2006.01)
*G01P 15/08* (2006.01)

(56) References Cited

U.S. PATENT DOCUMENTS

2016/0207756 A1* 7/2016 Chang .................. B81B 3/0005
2016/0332863 A1* 11/2016 Cheng .................... H01L 24/00
2019/0002273 A1* 1/2019 Chang .................. B81B 3/0005
2019/0341305 A1* 11/2019 Kim .................. H01L 21/76865

* cited by examiner

SELECTIVE SELF-ASSEMBLED MONOLAYER PATTERNING WITH SACRIFICIAL LAYER FOR DEVICES

CROSS-REFERENCE TO RELATED APPLICATIONS

This application claims the benefit of U.S. Provisional Application Ser. No. 62/915,195, filed Oct. 15, 2019, and entitled "SELECTIVE SAM PATTERNING WITH SACRIFICIAL GERMANIUM FOR 6-AXIS MOTION SENSOR," the entirety of which is expressly incorporated herein by reference.

BACKGROUND

Micro-Electro-Mechanical Systems (MEMS) is a class of structures and/or devices that are fabricated using semiconductor-like processes. MEMS structures and/or devices exhibit mechanical characteristics that include the ability to move or to deform. Examples of MEMS devices include, but are not limited to, gyroscopes, accelerometers, magnetometers, pressure sensors, radio-frequency components, and so on. Silicon wafers that include MEMS structures are referred to as MEMS wafers. Unique challenges exist to provide MEMS devices and/or structures with improved performance and reliability.

BRIEF DESCRIPTION OF THE DRAWINGS

Various non-limiting embodiments are further described with reference to the accompanying drawings in which.

DETAILED DESCRIPTION

Figure 1:
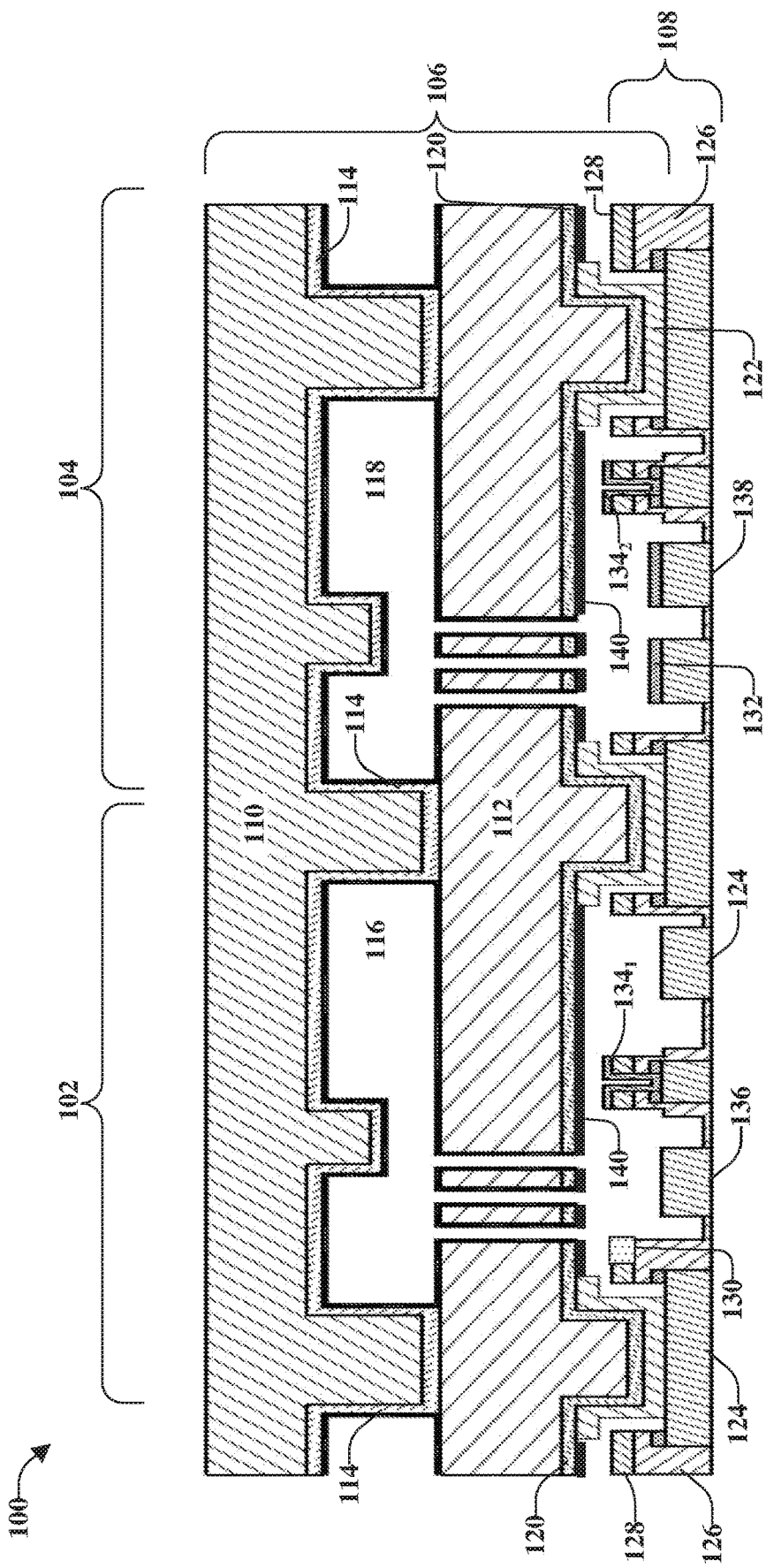
FIG. 1 illustrates a cross-sectional view of an example, non-limiting, device that includes a self-assembled monolayer on various portions of the device.

One or more embodiments are now described more fully hereinafter with reference to the accompanying drawings in which example embodiments are shown. In the following description, for purposes of explanation, numerous specific details are set forth in order to provide a thorough understanding of the various embodiments.

According to an embodiment, provided is a sensor device that can include a handle layer and a device layer that comprises a first side and a second side. First portions of the first side are operatively connected to defined portions of the handle layer. At least one area of the second side comprises an anti-stiction area formed with an anti-stiction coating. The device can also include a Complementary Metal-Oxide-Semiconductor (CMOS) wafer operatively connected to second portions of the second side of the device layer. The CMOS wafer comprises at least one bump stop. The anti-stiction area faces the at least one bump stop.

In an example, the device layer comprises a bonding layer, a silicon layer, and a sacrificial layer disposed over the silicon layer. Further to this example, the bonding layer and the sacrificial layer comprise germanium or aluminum. In some cases, the bonding layer comprises a first layer of germanium or a first layer of aluminum and the sacrificial layer comprises a second layer of germanium or a second layer of aluminum. According to some implementations, the anti-stiction area is formed on silicon.

In another example, the bonding layer is thicker than the sacrificial layer. Further to this example, the bonding layer of germanium is between around ten times and around twenty times thicker than the sacrificial layer.

According to some implementations, the device can include a cavity between the device layer and the handle layer. The cavity is delineated by the defined portions of the handle layer.

Further, in some implementations, the sensor device is divided into a first region and a second region. The first region comprises the anti-stiction area. The second region does not include the anti-stiction area. For example, the first region is an accelerometer region and the second region is a gyroscope region.

In some implementations, the anti-stiction coating is a Self-Assembled Monolayer (SAM) coating. Further, the anti-stiction area is a patterned SAM area. According to some implementations, the device layer is a Micro-Electro-Mechanical Systems (MEMS) wafer.

According to another embodiment, provided is a method of fabricating a sensor device. The method can include bonding first portions of a handle layer to a first side of a device layer, forming a bonding layer on a first portion of a second side of the device layer, and forming a sacrificial layer on a second portion of the second side of the device layer. Further, the method can include depositing an anti-stiction coating on the device layer and removing portions of the anti-stiction coating, resulting in a first remaining portion of the anti-stiction coating. In addition, the method can include bonding the first portion of the second side of the device layer to a Complementary Metal-Oxide-Semiconductor (CMOS) wafer.

In an example, the first remaining portion of the anti-stiction coating corresponds with a location of a bump stop of the CMOS wafer. Further, the anti-stiction coating is a Self-Assembled Monolayer (SAM) coating. According to another example, prior to depositing the anti-stiction coating, the method can include etching the sacrificial layer to be thinner than a thickness of the bonding layer.

In some implementations, prior to bonding first portions of the handle layer to a first side of the device layer, the method can include forming at least one cavity in the handle layer. According to some implementations, the method can include forming an oxide layer in the handle layer prior to bonding the first portion of the second side of the device layer. The bonding can include eutectically bonding a germanium layer of an aluminum layer of the bonding layer to an aluminum or a germanium layer on the CMOS wafer.

FIG. 1 illustrates a cross-sectional view of an example, non-limiting, device 100 that includes a self-assembled monolayer on various portions of the device 100. According to some implementations, the device 100 can be a sensor device. For example, the device can be an accelerometer, a gyroscope, or another sensor device. In another example, the device can include functionalities associated with an accelerometer, a gyroscope, or another sensor device. Thus, the device can be a single sensor function device, or can include a single sensor functionality. However, according to some implementations, the device 100 can be a dual-function sensor device, as illustrated in FIG. 1. The device 100 includes both an accelerometer and a gyroscope (or functionalities associated with an accelerometer and a gyroscope). Thus, the device 100 includes an accelerometer region or accelerometer side 102 and a gyroscope region or gyroscope side 104.

Further, the device 100 includes a Micro-Electro-Mechanical Systems wafer portion (MEMS wafer portion 106) and a Complementary Metal-Oxide-Semiconductor wafer portion (CMOS wafer portion 108). The MEMS wafer portion 106 can include a handle 110, one or more cavities in the handle 110, and a device layer 112 that is operatively connected to the handle 110 via a fusion bond oxide layer 114.

As mentioned, since the device 100 of FIG. 1 is a dual function device, the handle 110 includes, for the accelerometer side 102, a first cavity, referred to as an accelerometer cavity 116 (or simply accel cavity), and a second cavity, referred to as a gyroscope cavity 118 (or simply gyro cavity). It is noted that if the device were a single function device, the device might include only one cavity in the handle. For example, if the device is an accelerometer, the device would include only an accelerometer cavity. In another example, if the device is a gyroscope, the device would include only a gyroscope cavity.

The device layer 112 can include a layer of rough polysilicon 120 and a bonding material or bonding layer 122. The material of the bonding layer 122 can include, for example, Germanium (Ge). The bonding layer 122 can be used for the eutectic bonding between the MEMS wafer portion 106 and the CMOS wafer portion 108.

The CMOS wafer portion 108 can include a bonding metal 124, which can be also referred to as a top metal. The top metal can comprise Aluminum and Copper such as AlCu, for example. Further, the CMOS wafer portion 108 can include a passivation oxide layer 126 and a passivation nitride layer 128. Also included in the CMOS wafer portion 108 is an outgassing layer 130 on the accelerometer side 102. It is noted that there is not an outgassing layer on the gyroscope side 104. The CMOS wafer portion 108 also includes a getter 132, which can be formed of Titanium (Ti), and one or more conductive bump stops, illustrated as a first conductive bump stop $134_1$ and a second conductive bump stop $134_2$. There can be a sense or shield electrode 136 on the accelerometer side 102, and another sense or shield electrode 138 on the gyroscope side 104.

It is noted that prior to the bonding of the MEMS wafer portion 106 and the CMOS wafer portion 108, a Self-Assembled Monolayer (SAM) coating 140 can be applied to (e.g., deposited on) the device layer 112. As indicated, the SAM coating 140 covers many exposed portions since patterning of the SAM coating 140 is not able to be performed. The SAM coating 140 is on the silicon (of the MEMS wafer portion 106) facing the CMOS wafer portion 108.

The SAM coating is applied on the proof mass for accelerometer stiction improvement between the proof mass and the bump stop on the CMOS wafer portion 108. It is noted that the proof mass is formed when the device layer is patterned. Side effects of the SAM coating on the proof mass will impact the offset behavior in the reliability test. When there is a large amount of SAM coating, it carries a large amount of charge and this charge is drifting in the reliability test and there is a side effect on accelerometer performance and gyroscope performance. For example, on the accelerometer side 102, the charging effect from the SAM coating on the proof mass surface manifests as an accelerometer offset drift during a reliability test. On the gyroscope side 104, the charging effect from the SAM coating on the proof mass surface increases a sensitivity shift in a reliability test.

To overcome the effects of the SAM coating, the disclosed aspects provide selective SAM patterning with a sacrificial layer (e.g., a sacrificial germanium layer). Advantages of the disclosed aspects include, but are not limited to, leaving the SAM coating on the portion of the proof mass contacting the bump stop only on the accelerometer side of the device. This can reduce the charging substantially. Another advantage is that the disclosed aspects facilitate removal of the SAM coating on the proof mass on the gyroscope side of the device. This can eliminate the charging and can provide better gyroscope cavity pressure stability (due to less SAM outgassing from eutectic-bond and post bond anneal step).

The integration process, as will be discussed in further detail below, includes a bonding layer (e.g., a first Ge layer) sputter and patterning, which is the eutectic bonding layer, and a sacrificial layer (e.g., a second Ge layer) sputter and patterning, which is the sacrificial layer for SAM patterning. The sacrificial layer can be much thinner than the bonding layer. For example, the sacrificial layer can be about 10 to 20 times thinner than the bonding layer. The integration process also includes removal of the sacrificial layer on the proof mass contacting the bump stop on the CMOS portion. Further, device layer etch includes etching a stack that includes the sacrificial layer and the silicon. According to some implementations, etching the stack of the sacrificial layer and the silicon can be performed utilizing a single mask. Thereafter, pre-treatment and SAM deposition is performed. Next, thermal treatment for partial SAM removal is performed. A timed etch can be performed followed by eutectic bonding to complete the integration process. The duration of the timed etch can be selected such that the target etch amount is the thickness of the sacrificial layer.

As mentioned, the SAM coating cannot be patterned on most of the device. For example, the SAM coating cannot be patterned on the sidewall of the proof mass, on the backside of the proof mass, or on the cavity surface of the handle layer. However, in accordance with the disclosed aspects, the SAM coating can be patterned on the proof mass. According to the disclosed aspects, the SAM coating is removed from many portions, except for the SAM coating on the proof mass that is directly facing the conductive bump stop.

Accordingly, as discussed herein, all the SAM coating on the gyroscope side can be etched away (e.g., removed). Further, all the SAM coating on the accelerometer side 102 is etched away or removed, except for the portion directly facing the conductive bump stop.

By etching away most of the SAM coating as discussed herein, the charging effects can be reduced and, accordingly, there can be an offset shift reduction on the accelerometer side. Further, the charging effect on the gyroscope side can be improved, which can improve the gyroscope sensitivity drift in the reliability test. Then, initial lower gyroscope cavity pressure and better gyroscope cavity pressure stability can be achieved with the disclosed embodiments.

To facilitate etching away most of the SAM coating, while leaving the SAM coating portion that is directly facing the conductive bump stop, selective SAM patterning can be performed on the silicon facing the CMOS wafer. A sacrificial layer can be used for the selective SAM patterning. Further details will be discussed with respect to FIGS. 2-9 which illustrate process steps for fabricating a sensor device according to the embodiments provided herein.

Figure 2:
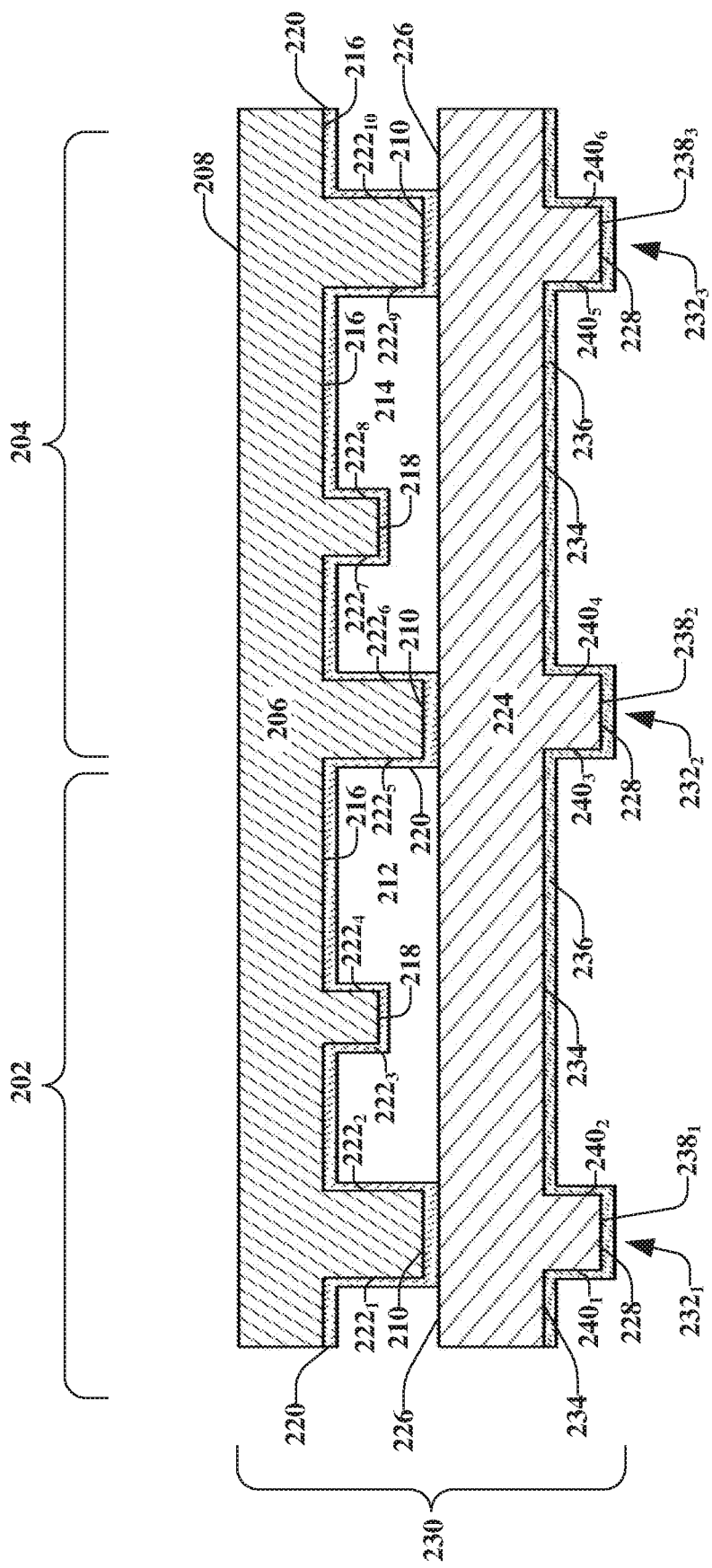
FIG. 2 illustrates a cross-sectional view of initial process steps for formation of a device in accordance with one or more embodiments described herein.

FIG. 2 illustrates a cross-sectional view of initial process steps for formation of a device in accordance with one or more embodiments described herein. Repetitive description of like elements employed in other embodiments described herein is omitted for sake of brevity.

The device being formed with respect to FIGS. 2-9 can be similar to the device 100 of FIG. 1, is a dual function device and, therefore, includes an accelerometer region or accelerometer side 202 (e.g., the accelerometer side 102) and a gyroscope region or gyroscope side 204 (e.g., the gyroscope side 104). A handle MEMS layer 206 (e.g., the handle 110) is illustrated. The handle MEMS layer 206 can refer to a substrate that can be used as a carrier for a thinner substrate. The handle MEMS layer 206 can have a thickness that is thicker than other substrates. The handle MEMS layer 206 can initially comprise a first handle surface 208 and a second handle surface 210. The first handle surface 208 and the second handle surface 210 are on opposite sides of the handle MEMS layer 206.

One or more cavities can be formed in the handle MEMS layer 206. A cavity refers to an opening or recession in a substrate layer (e.g., the handle MEMS layer 206). In the example illustrated, there are two cavities, namely, a first cavity, which is an accelerometer cavity 212 (e.g., the accelerometer cavity 116), and a second cavity, which is a gyroscope cavity 214 (e.g., the gyroscope cavity 118), formed in the handle MEMS layer 206. Although two cavities are illustrated, another number of cavities (e.g., one or more) can be formed in the handle MEMS layer 206 according to various implementations.

As illustrated, after the one or more cavities are formed, the handle MEMS layer 206 can have surfaces in addition to the first handle surface 208 and the second handle surface 210.

The third handle surface 216 and the fourth handle surface 218 are on same side of the handle MEMS layer 206 as the second handle surface 210. Thus, the first handle surface 208 is on a first side of the handle MEMS layer 206, and the second handle surface 210, the third handle surface 216, and the fourth handle surface 218 are on a second side of the handle MEMS layer 206, where the first side and the second side are opposite sides of the handle MEMS layer 206. Further, a first thickness of the handle MEMS layer 206 between the first handle surface 208 and the fourth handle surface 218 is thinner than a second thickness of the handle MEMS layer 206 between the first handle surface 208 and the third handle surface 216, which is thinner than a third thickness of the handle MEMS layer 206 between the first handle surface 208 and the second handle surface 210.

Upon or after the cavity formation, an insulating layer 220 can be deposited on, or bonded to, the handle MEMS layer 206. According to an implementation, the insulating layer 220 can be an oxide layer. The insulating layer 220 can line or cover at least a portion of the handle MEMS layer 206. For example, the insulating layer 220 can cover, or be deposited over, the second handle surface 210, the third handle surface 216, and the fourth handle surface 218. Further, the insulating layer 220 can cover, or be deposited over, or adjacent, the sides of the portions of the handle MEMS layer 206 that are formed by the one or more cavities, as indicated at side portions $222_1$, $222_2$, $222_3$, $222_4$, $222_5$, $222_6$, $222_7$, $222_8$, $222_9$, and $222_{10}$.

Defined portions of the handle MEMS layer 206 can be bonded to at least a portion of a device layer 224. The one or more cavities can be delineated by the defined portions of the handle MEMS layer. The defined portions can correspond with the second handle surface 210. For example, the insulating layer 220 can be a fusion bond oxide, which can facilitate the bonding of the handle MEMS layer 206 to the device layer 224 via fusion bond oxide deposition. As illustrated, one or more portions of the second handle surface 210 of the handle MEMS layer 206 can be bonded to corresponding portions of a first side or first surface area 226 of the device layer 224. The bonding can comprise fusion bonding or another fusion technique or fusion process. According to some implementations, the device layer 224 can be a silicon layer. According to some implementations, the silicon layer can comprise P+, N+doped, and/or N++ doped material.

Upon or after the bonding, a grinding and polishing process (or separate grinding and polishing processes) can be performed. For example, the device layer 224 can be thinned to obtain a defined device layer thickness. The thickness of the device layer 224 can be determined based on the type of device, desired functionality of the device, an application or usage of the device, and so on. According to a non-limiting example, the device layer 224 can be thinned to a range of around 30 micrometers to about 32 micrometers.

According to some implementations, chemical-mechanical polishing or planarization (CMP) process can be performed. CMP is a polishing process that can be utilized to smooth surfaces. For example, CMP process can utilize a chemical slurry formation and a mechanical polishing process to obtain the smooth surfaces. As illustrated, the CMP process can create a level surface across the device layer 224, such as a second side or second surface area 228. The first surface area 226 and the second surface area 228 are located on opposite sides of the device layer 224.

The handle MEMS layer 206 and the device layer 224, when combined, can form a MEMS wafer portion 230 (e.g., the MEMS wafer portion 106) of the device. Upon or after the formation of the MEMS wafer portion 230 (or before), one or more standoffs, illustrated as a first standoff $232_1$, a second standoff $232_2$, and a third standoff $232_3$ can be provided on the device layer 224. Illustrated are three standoffs, however, the disclosed aspects are not limited to this implementation and fewer or more standoffs can be formed on the device layer 224. According to some implementations, the one or more standoffs (e.g., the first standoff $232_1$, the second standoff $232_2$, and the third standoff $232_3$) can be patterned on the device layer 224. The one or more standoffs can be used as one or more eutectic bonding locations for bonding with a CMOS wafer, as will be described with respect to FIG. 8 and FIG. 9.

Another mask (e.g., a third mask or Mask3) can be used to perform standoff patterning (e.g., creation of the one or more standoffs). For example, the one or more standoffs can be patterned (during a standoff process) for the recess. Upon or after the patterning of the standoffs, a third surface area 234 can be defined for the device layer 224. The first surface area 226 is located on a first side of the device layer 224, and the second surface area 228 and the third surface area 234 are located on a second side of the device layer 224. A first device layer thickness between the first surface area 226 and the second surface area 228 is thicker than a second device layer thickness between the first surface area 226 and the third surface area 234.

Upon or after the one or more standoffs are provided, pre-cleaning can be performed in one step or in multiple steps (e.g., two or more steps). Upon or after the pre-cleaning, rough polysilicon 236 (e.g., the rough polysilicon 120) can be deposited over and adjacent portions of the device layer 224. For example, the rough polysilicon 236 can be deposited on the third surface area 234. Further, the rough polysilicon 236 can be deposited on the second surface area 228 (e.g., the bottom surfaces of the one or more standoffs) and the sides of the one or more standoffs. For example, the rough polysilicon 236 can be deposited on the bottom surface $238_1$ and side surfaces $240_1$ and $240_2$ of the first standoff $232_1$. Further, the rough polysilicon 236 can be deposited on the bottom surface $238_2$ and side surfaces $240_3$ and $240_4$ of the second standoff $232_2$. Additionally, the rough polysilicon 236 can be deposited on the bottom surface $238_3$ and side surfaces $240_5$ and $240_6$ of the third standoff $232_3$.

After patterning, the single crystallization layer can be etched, and a polysilicon can be deposited to around 0.5 micron to about 1 micro. Depositing the polysilicon can introduce roughness on the proof mass. Introducing roughness can improve the stiction because a rougher surface can reduce the surface area, which can reduce the stiction.

According to some implementations, the rough polysilicon 236 can be undoped polysilicon. Deposition of the rough polysilicon 236 can introduce surface roughness, which can increase a surface roughness of the rough polysilicon 236. Further, an anneal process can be performed, which can reduce the stress of the rough polysilicon 236.

Next, high temperature annealing can be performed. In accordance with some implementations, performing the high temperature annealing can comprise doping the rough polysilicon 236 from implanted dopants. The temperature used for the high temperature annealing can comprise a temperature in a range between around 700 degrees Celsius and about 1100 degrees Celsius. In some cases, the temperature used for the high temperature annealing can comprise a temperature in a range between around 700 degrees Celsius and about 950 degrees Celsius.

Figure 3:
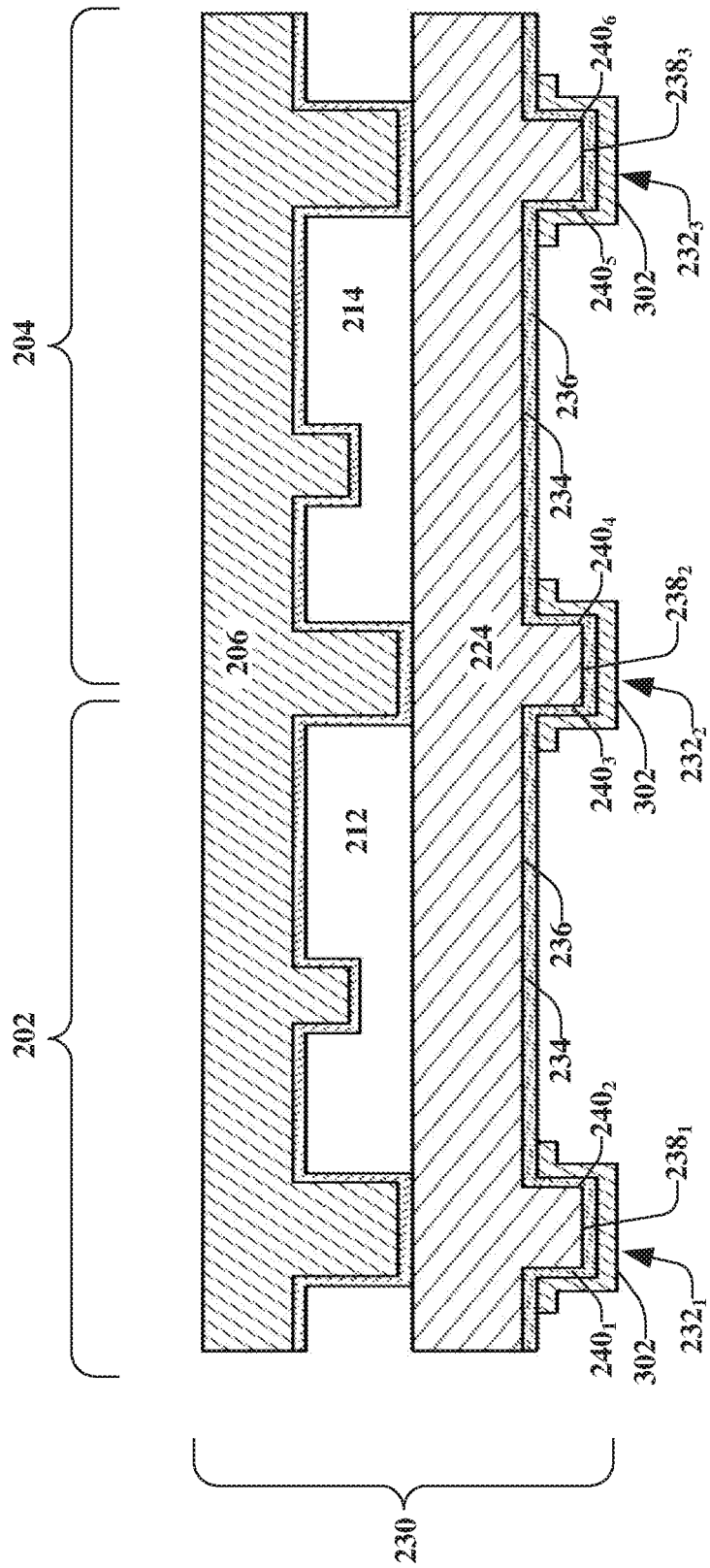
FIG. 3 illustrates a cross-sectional view of next stages of formation of the device in accordance with one or more embodiments described herein.

FIG. 3 illustrates a cross-sectional view of next stages of formation of the device in accordance with one or more embodiments described herein. Repetitive description of like elements employed in other embodiments described herein is omitted for sake of brevity.

As illustrated, a bonding layer 302 (e.g., the bonding layer 122) can be provided on the rough polysilicon 236 located at the respective bottom surfaces $238_1$, $238_2$, $238_3$, and side surfaces $240_1$, $240_2$, $240_3$, $240_4$, $240_5$, $240_6$ of the one or more standoffs (e.g., over and adjacent the rough polysilicon 236 at those areas). In some cases, the bonding layer 302 can be applied to portions of the third surface area 234 of the device layer 224 (e.g., on the rough polysilicon 236) that are located on either side of the one or more standoffs. For example, the bonding layer 302 can be provided by depositing and patterning the one or more standoffs.

The bonding layer 302 can be deposited or sputtered and patterned. A fourth mask (Mask4) can be used at this step of the process. The patterning can be wet etch or dry etch. The bonding layer 302 can comprise Ge and can be referred to as a first Ge layer. According to some implementations, the bonding layer 302 can comprise a eutectic bonding material, such as Ge—AlCu. Accordingly, the bonding layer 302 can facilitate the eutectic bonding with a CMOS wafer (e.g., with a metal, such as aluminum, of the CMOS wafer), as will be described in further detail below.

Figure 4:
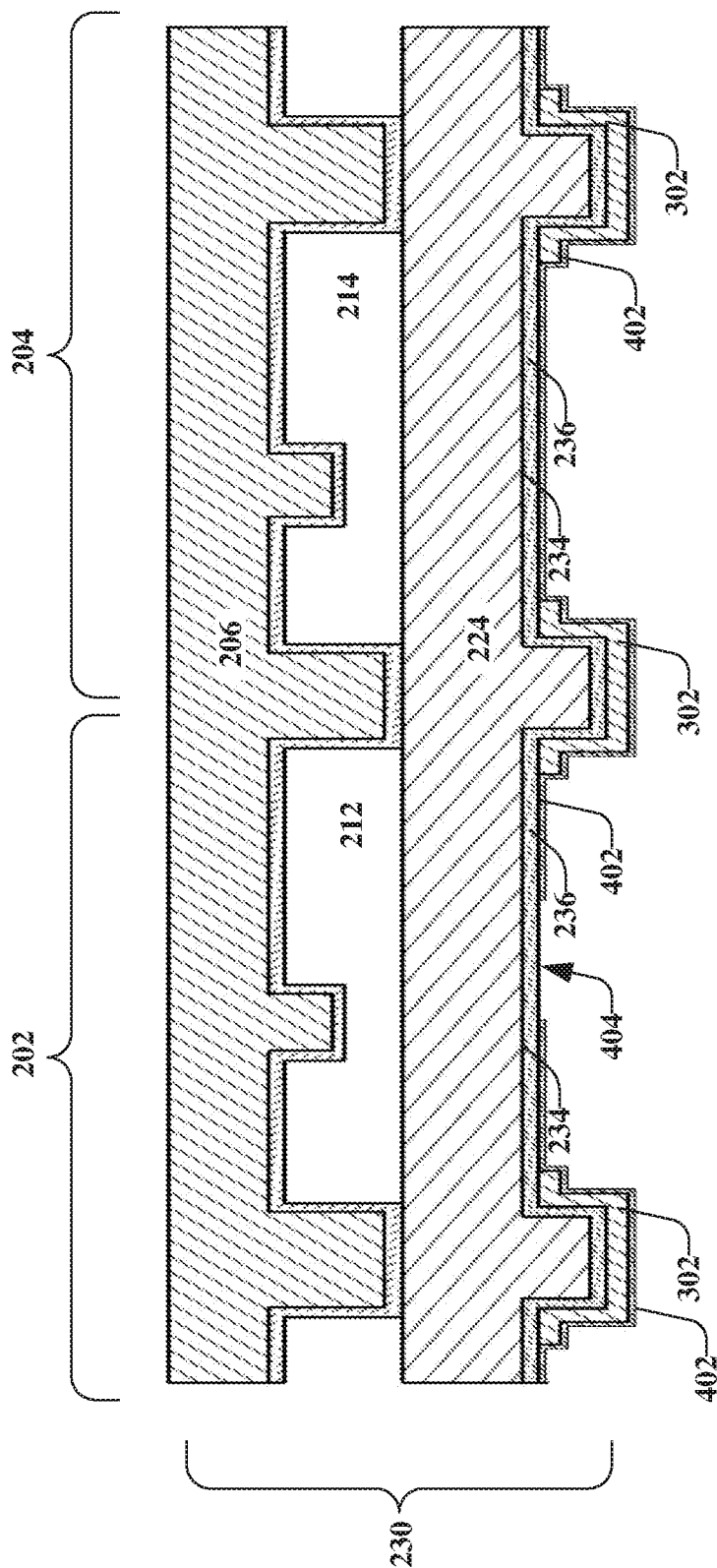
FIG. 4 illustrates a cross-sectional view of further stages of formation of the device in accordance with one or more embodiments described herein.

FIG. 4 illustrates a cross-sectional view of further stages of formation of the device in accordance with one or more embodiments described herein. Repetitive description of like elements employed in other embodiments described herein is omitted for sake of brevity.

A sacrificial layer 402 can be deposited over at least a portion of the bonding layer 302 (referred to as a first Ge layer) and over the third surface area 234 (e.g., over the rough polysilicon 236). The sacrificial layer 402 can comprise Ge and can be referred to as a second Ge layer. A thickness of the sacrificial layer 402 is thinner than a thickness of the bonding layer 302. According to some implementations, the sacrificial layer 402 can be thinner than the bonding layer 302 in a range of about ten to around twenty times thinner. The sacrificial layer (e.g., the second Ge layer) is considered a sacrificial layer for selective SAM patterning. For example, the sacrificial layer 402, or at least a portion thereof, will be removed to facilitate the SAM patterning.

Upon or after deposition of the sacrificial layer 402, the sacrificial layer 402 can be sputtered. Then, using the same or a similar type of etch chemistry and using a proof mass, the sacrificial layer 402 can be patterned for selective SAM patterning. The patterning of the sacrificial layer 402 can be facilitated with a fifth mask (Mask5). For example, only a portion of the sacrificial layer 402 located at a specific location 404 is removed. As illustrated, the other portions of the sacrificial layer 402 have not been removed. The specific location 404 can correspond with a contact area for a CMOS bump stop, as will be discussed with respect to FIG. 9.

Figure 5:
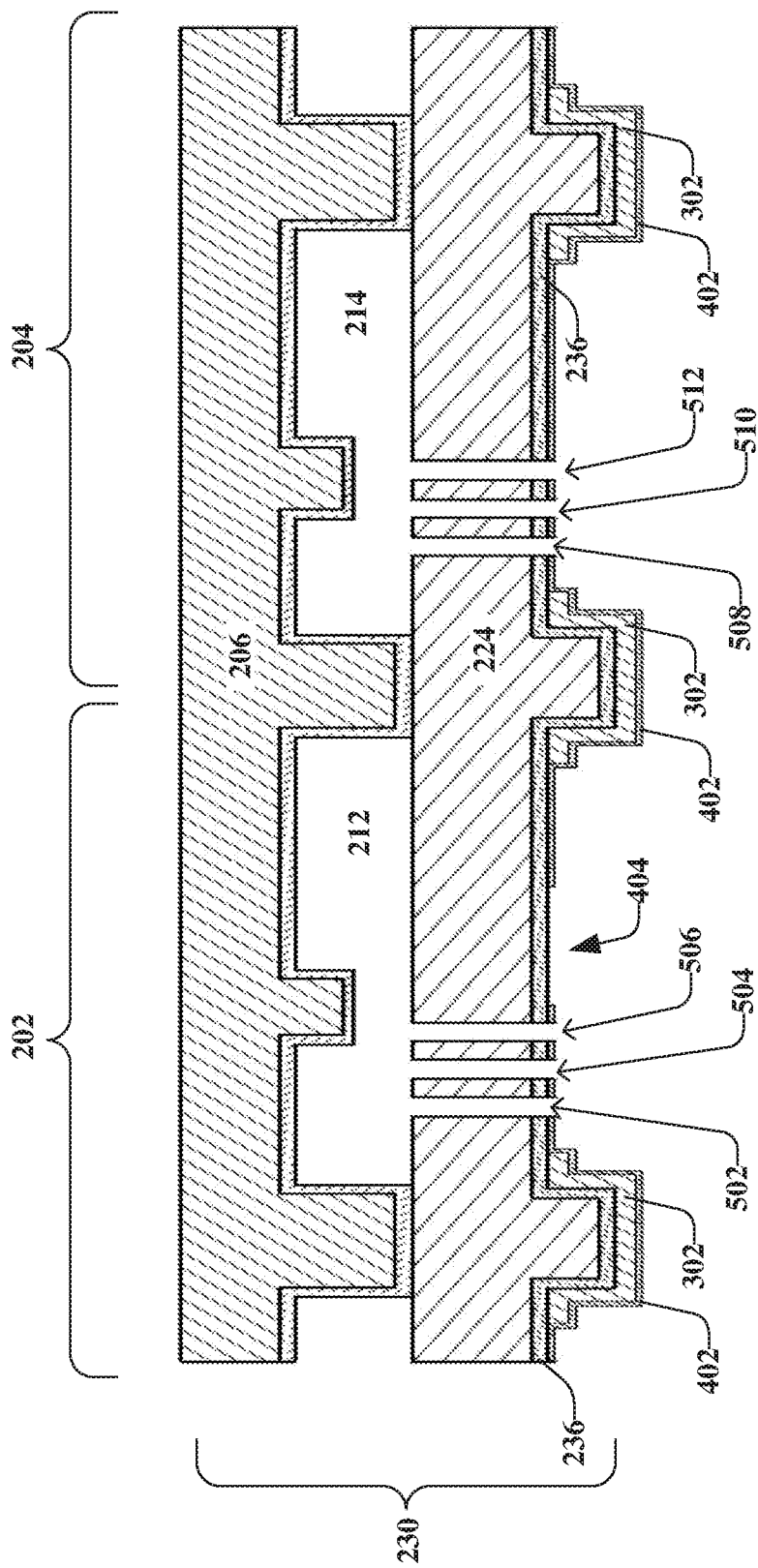
FIG. 5 illustrates a cross-sectional view of additional stages of formation of the device in accordance with one or more embodiments described herein.

FIG. 5 illustrates a cross-sectional view of additional stages of formation of the device in accordance with one or more embodiments described herein. Repetitive description of like elements employed in other embodiments described herein is omitted for sake of brevity.

The device layer 224 can undergo lithography and etch processes. For example, the device layer 224 can undergo a Deep Reactive-Ion Etching (DRIE) process to create deep penetration, steep-sided holes, and trenches in the device layer 224. Example areas are indicated at areas 502, 504, and 506 of the accelerometer side 202; and areas 508, 510, and 512 of the gyroscope side 204. The device layer 224 can be etched using, for example, a sixth mask (Mask6).

In some implementations, a stack that includes the sacrificial layer 402 and the silicon (e.g., the device layer 224, the rough polysilicon 236) can be etched by DRIE. The stack (e.g., the second bonding layer and the silicon) can be etched utilizing a single mask. It is noted that in an alternate implementation, the patterning step for the sacrificial layer 402 can be designed or engineered (e.g., pre-patterned) such that the silicon layer can be etched without using the sacrificial layer.

Figure 6:
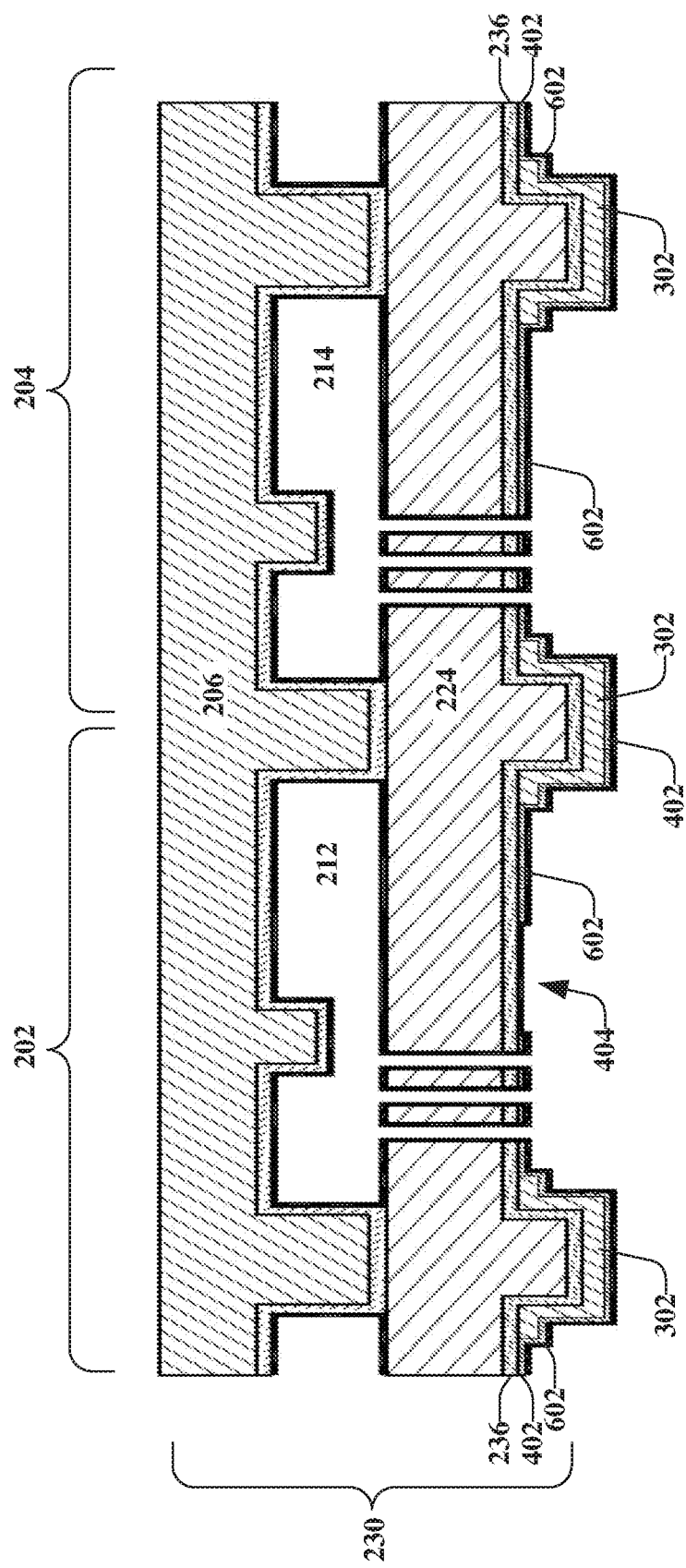
FIG. 6 illustrates a cross-sectional view of a selective Self-Assembled Monolayer (SAM) patterning stage during formation of the device in accordance with one or more embodiments described herein.

FIG. 6 illustrates a cross-sectional view of a selective Self-Assembled Monolayer (SAM) patterning stage during formation of the device in accordance with one or more embodiments described herein. Repetitive description of like elements employed in other embodiments described herein is omitted for sake of brevity.

The next step is pretreatment before deposition of an anti-stiction coating, referred to as a SAM coating 602 (e.g., the SAM coating 140). Oxidation (thin oxide) can be used in order to have a better adhesion of the SAM coating to the silicon. Improving SAM adhesive means increasing the water contact angle. For the SAM, the water contact angle is around 90 degrees to about 105 degrees.

The SAM coating can be an anti-stiction layer. According to some implementations, the SAM coating can be, for example, perfluorodecyltrichlorosilane (FDTS) or another self-assembled monolayer. As mentioned, the SAM coating 602 is everywhere (e.g., on all exposed surfaces), as indicated in FIG. 6, because the SAM coating 602 is a surface layer that is coated everywhere on the exposed surfaces. The sidewall, the proof mass, the second Ge layer, the fusion oxide, the backside, and so on. Accordingly, as discussed herein, there is patterning of the SAM coating 602 otherwise the bonding layer 302 will not bond with the aluminum of the CMOS for the eutectic bonding, as will be discussed with respect to FIG. 9 below.

Figure 7:
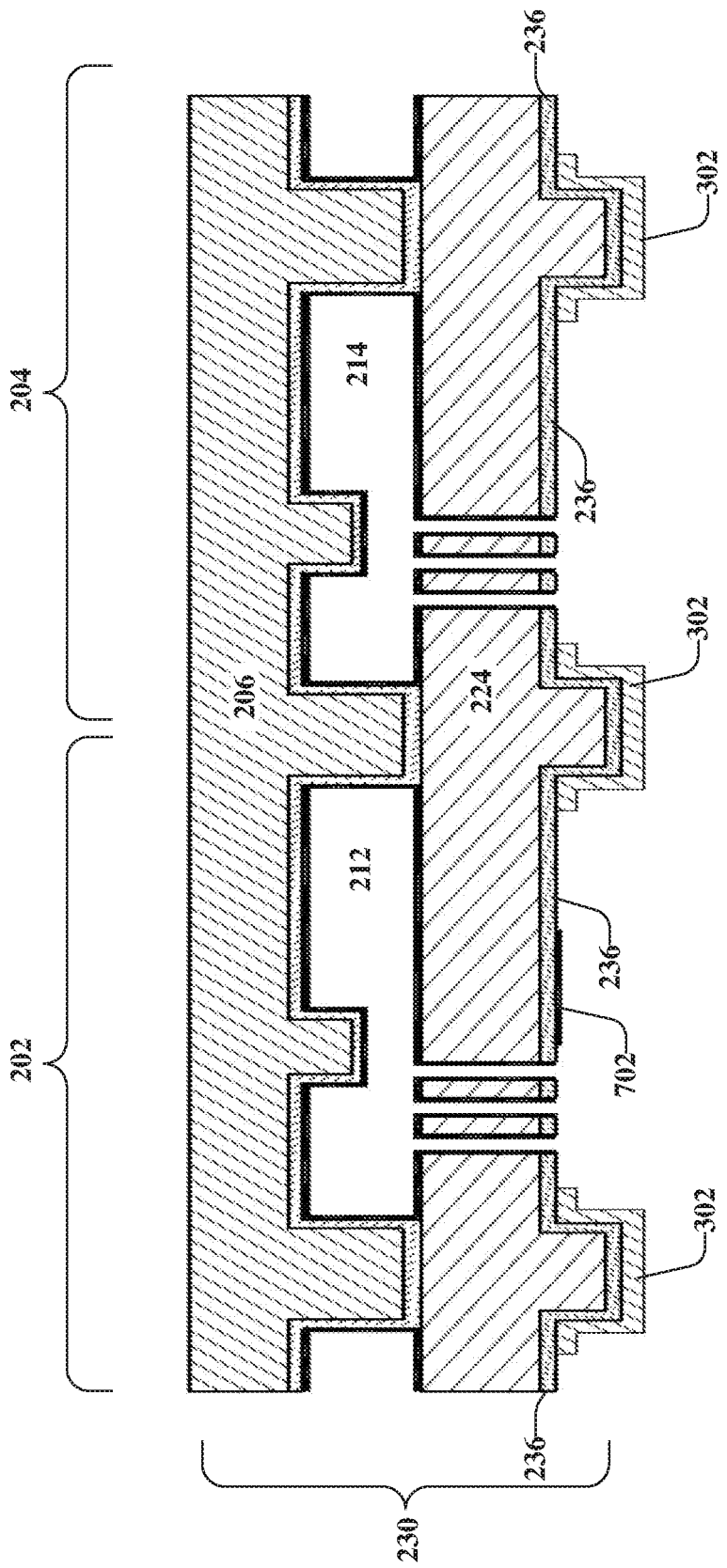
FIG. 7 illustrates a cross-sectional view of further stages of formation of the device in accordance with one or more embodiments described herein.

FIG. 7 illustrates a cross-sectional view of further stages of formation of the device in accordance with one or more embodiments described herein. Repetitive description of like elements employed in other embodiments described herein is omitted for sake of brevity.

Upon or after the SAM coating 602 is deposited, thermal treatment can be utilized to facilitate selective removal of at least a portion of the SAM coating 602, leaving a remaining portion of SAM coating (or anti-stiction area formed with the anti-stiction coating), as indicated at remaining SAM portion 702.

To facilitate etching away (or removal of) various portions of the SAM coating 602, the sacrificial layer 402 can be used as a sacrificial layer. By sacrificial layer, it is meant that the sacrificial layer 402 is used for the selective SAM patterning and does not remain after the selective SAM patterning. Accordingly, according to some implementations, the sacrificial layer does not exist in the finished device. For example, in FIG. 7 the sacrificial layer 402 is gone or no longer exists on the MEMS wafer portion 230.

Thermal treatment post SAM coating includes using a temperature that is high enough to remove the SAM coating while still maintaining the integrity of the silicon oxide. Accordingly, a temperature appropriate for the materials of the device can be chosen. For SAM on silicon, the temperature should be selected to maintain SAM quality (wafer contact angle). In a similar manner, for SAM on oxide, the temperature should be selected to maintain SAM quality (wafer contact angle). For SAM on Ge, the temperature should be selected to partially remove the SAM coating. Accordingly, for SAM on silicon and SAM on oxide, the SAM coating is maintained. However, for SAM on Ge most of the SAM coating is removed, except for the portion directly facing the bump stop (the remaining SAM portion 702 as illustrated in FIG. 7). It is noted that the remaining SAM portion 702 has SAM on oxide (thin)/silicon because the Ge was removed by the previous patterning. In some embodiments a thin layer of SAM may be left on Ge in the process. Therefore, SAM on Ge has less thermal stability than SAM on silicon and/or SAM on oxide. According to some implementations, the thermal treatment post SAM coating can include using a temperature in a range around 300 to 400 degrees Celsius.

Further, for second bonding layer etch, the etching can be based on a timed etch. In contrast, for SAM coating on silicon, there is no etching. According to some implementations, the thermal treatment and the timed etch (e.g., a second Ge timed etch) can be combined. For example, after finishing the thermal treatment step, there can be SAM residue on top of the sacrificial layer and there can be a sacrificial layer etch process step. The same type of chemistry as the patterning for the bonding layer can be used for the sacrificial layer. For example, the same wet chemistry to etch the SAM layer can be used. This chemistry is selective to the SAM coating and silicon and, therefore, any SAM residue on the bonding layer can be washed away at the same time that the sacrificial layer is removed.

Figure 8:
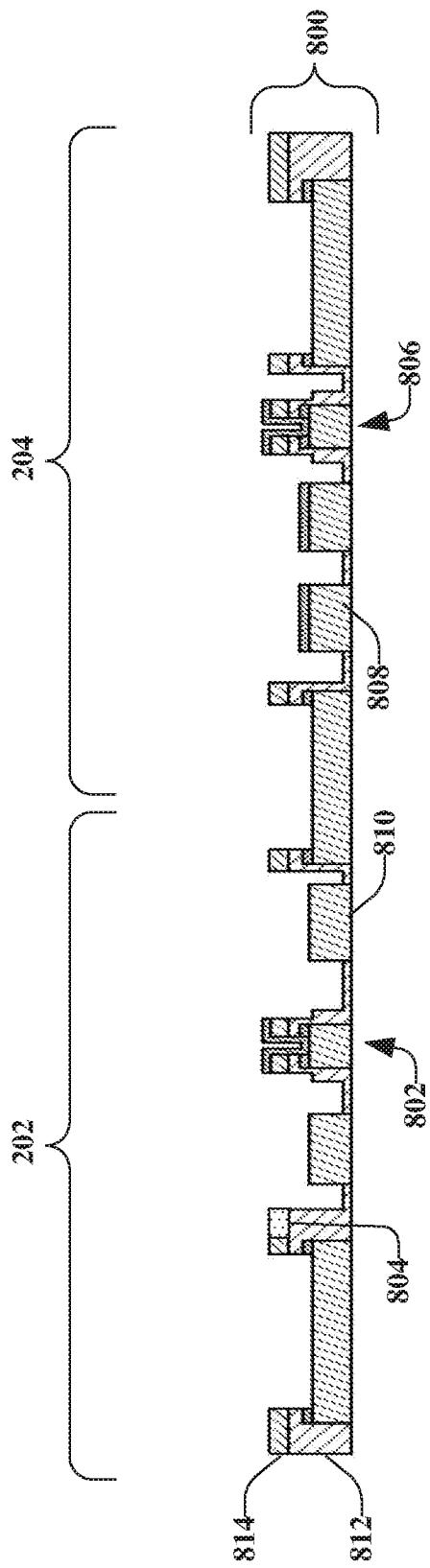
FIG. 8 illustrates a cross-sectional view of Complementary Metal-Oxide-Semiconductor (CMOS) wafer processing for formation of the device in accordance with one or more embodiments described herein.

FIG. 8 illustrates a cross-sectional view of CMOS wafer 800 processing for formation of the device in accordance with one or more embodiments described herein. Repetitive description of like elements employed in other embodiments described herein is omitted for sake of brevity.

For the accelerometer side 202, the CMOS wafer 800 processing can include formation of a conductive bump stop 802, passivation etch, and formation of an outgassing layer 804. For the gyroscope side 204, the CMOS wafer 800 processing can include formation of a conductive bump stop 806, passivation etch, and formation of a getter 808, which can be a Ti getter, for example.

In further detail, the CMOS wafer 800 includes a top metal 810, which can comprise Aluminum and Copper such as AlCu and/or Titanium (Ti). For example, on the accelerometer side 202, the top metal can include aluminum. On the gyroscope side 204, the top metal can include a titanium layer on top of aluminum for the etching purpose. It is noted that the aluminum is used for the eutectic bonding of the CMOS wafer 800 with the MEMS wafer portion 230.

A passivation oxide 812 is deposited to cover the bonding metal (e.g., the top metal 810). Thereafter, CMP can be performed for the planarization. Passivation nitride 814 can be deposited and the thin metal is exposed. Then outgassing layer patterning can be performed. In this case, the nitride is being replaced with outgassing layer in the CMP. Thereafter, bump stop via formation and bump stop patterning are performed. Then there are one or more passivation etch process steps. For example, there can be two steps of passivation etch to pattern the getter 808 (e.g., a Ti getter).

The outgassing layer 804 (e.g., HDP oxide) in the accelerometer side 202 facilitates increasing the cavity pressure (e.g., the pressure of the accelerometer cavity 212). It is noted that there is not an outgassing layer on the gyroscope side 204. The completed device will need very low cavity pressure for the gyroscope side 204, but a very high cavity pressure is needed on the accelerometer side 202.

The conductive bump stop 802 can be defined on top of the passivation nitride 814. In some cases, the bump stop material is Ti underneath and TiN on top.

Figure 9:
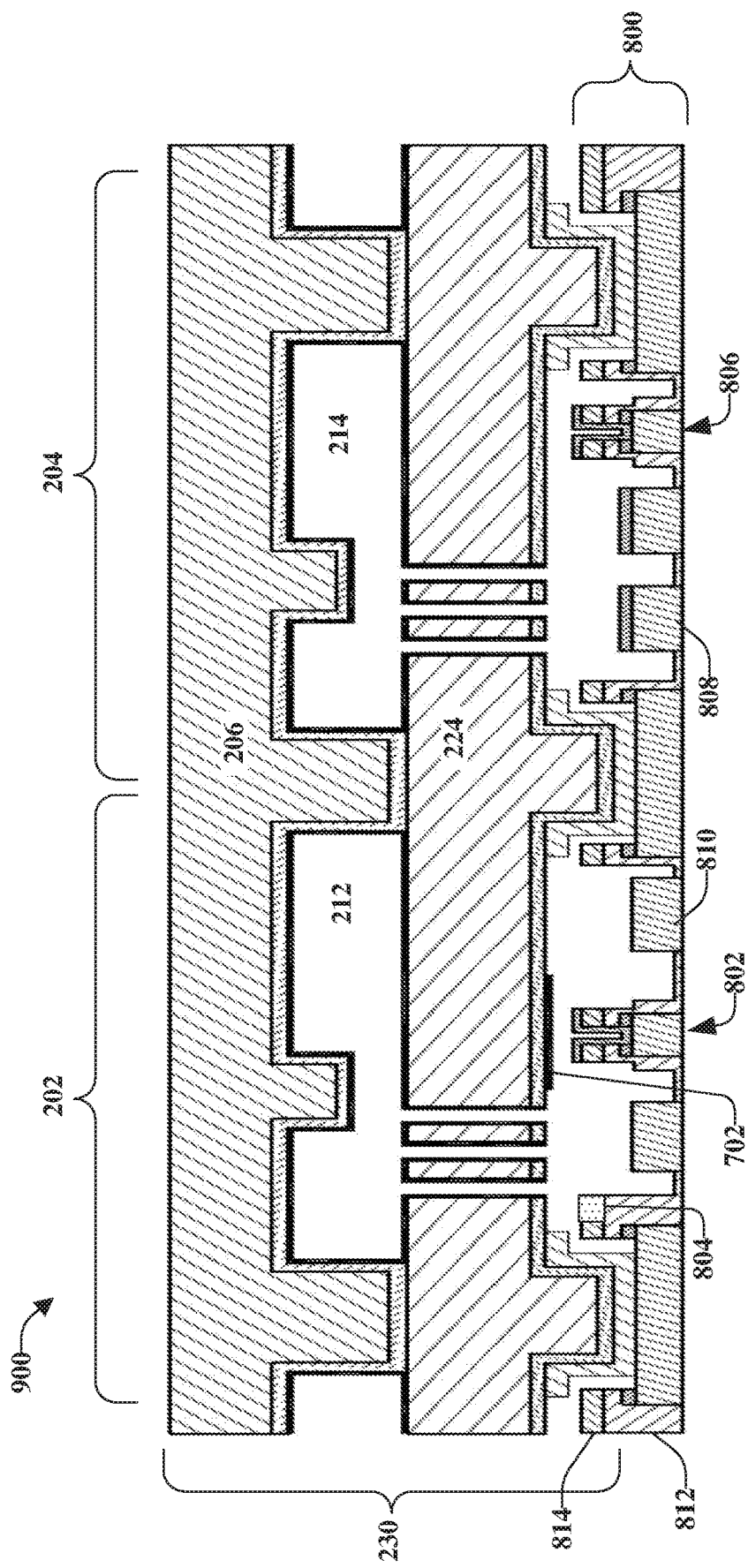
FIG. 9 illustrates an example, non-limiting, device having selective self-assembled monolayer patterning in accordance with one or more embodiments described herein.

Upon or after the formation of the CMOS layer, the MEMS wafer portion 230 can be eutectically bonded with the CMOS wafer 800 resulting in the device 900 of FIG. 9. As illustrated, the device 900 includes the accelerometer side 202 and the gyroscope side 204.

As illustrated in FIG. 9, the remaining SAM portion 702 remains at the area that directly faces the conductive bump stop 802 on the accelerometer side 202 (e.g., the anti-stiction area faces the at least one bump stop) of the CMOS wafer 800. However, the other portions of the SAM coating are removed. Thus, at least one area of the third surface area 234 comprises an anti-stiction area formed with an anti-stiction coating (e.g., the SAM coating 602).

It is noted that the SAM coating is not patternable, therefore, the SAM coating is everywhere prior to the selective removal as discussed herein. The SAM coating can improve the stiction and should be located adjacent a bump stop (e.g., the conductive bump stop 802), but is not necessary in other locations of the device 900. Further, SAM coating is not needed on the gyroscope side 204. The SAM coating is only needed where it is beneficial to improve the stiction in the plane direction.

By leaving the remaining SAM portion 702 on the proof mass that is contacting the conductive bump stop 802 (of the CMOS wafer 800) only on the accelerometer side 202, the charging can be reduced substantially. Further, by removing the SAM coating 602 on the proof mass on the gyroscope side 204, the charging can be eliminated. This can result in better gyroscope cavity pressure stability, which can be due to less SAM outgassing from eutectic-bond and post bond anneal step.

Accordingly, cross-sections before SAM coating comprises: silicon+ first layer of Ge+ second layer of Ge (eu-bond area); silicon+ second layer of Ge (selective SAM removal); and silicon (SAM area). After SAM coating and patterning (Ge etch): second layer of Ge is a sacrificial layer (it is noted that the second layer of Ge might not exist in the finished device).

Methods that can be implemented in accordance with the disclosed subject matter will be better appreciated with reference to various flow charts. While, for purposes of simplicity of explanation, the methods are shown and described as a series of blocks, it is to be understood and appreciated that the disclosed aspects are not limited by the number or order of blocks, as some blocks can occur in different orders and/or at substantially the same time with other blocks from what is depicted and described herein. Moreover, not all illustrated blocks can be required to implement the disclosed methods. It is to be appreciated that the functionality associated with the blocks can be implemented by software, hardware, a combination thereof, or any other suitable means (e.g., device, system, process, component, and so forth). Additionally, it should be further appreciated that the disclosed methods are capable of being stored on an article of manufacture to facilitate transporting and transferring such methods to various devices. Those skilled in the art will understand and appreciate that the methods could alternatively be represented as a series of interrelated states or events, such as in a state diagram.

Figure 10:
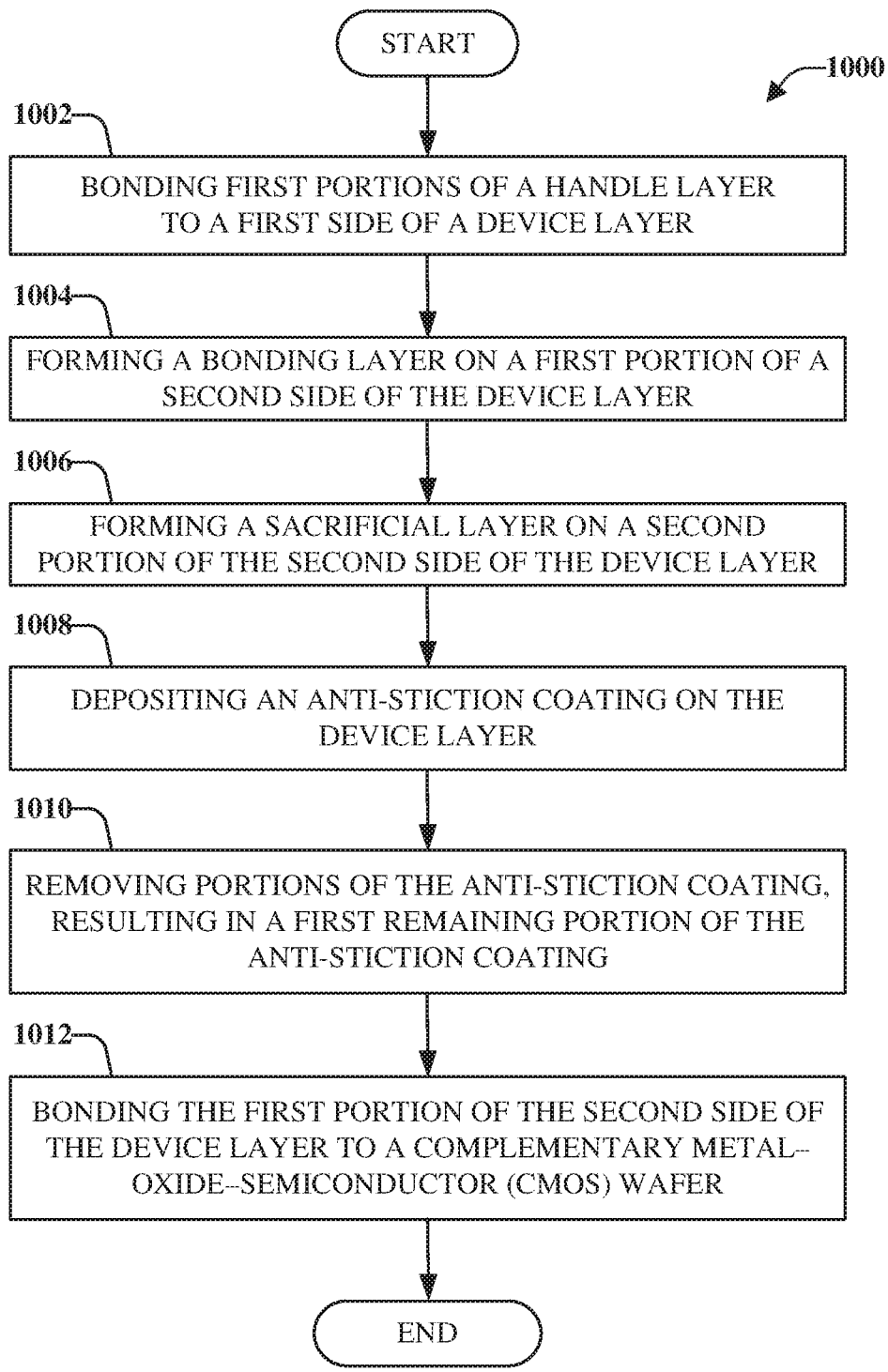
FIG. 10 illustrates a flow diagram of an example, non-limiting, method of fabricating a sensor device in accordance with one or more embodiments described herein.

FIG. 10 illustrates a flow diagram of an example, non-limiting, method 1000 of fabricating a sensor device in accordance with one or more embodiments described herein. Repetitive description of like elements employed in other embodiments described herein is omitted for sake of brevity.

The disclosed aspects relate to selectively removing or selectively patterning the SAM coating (e.g., the SAM coating 602) using a sacrificial layer (e.g., the sacrificial layer 402). The portion of the SAM coating on the proof mass, contacting (or directly facing) a bump stop (e.g., the conductive bump stop 802) of a CMOS wafer (e.g., the CMOS wafer 800) on the accelerometer side (e.g., the accelerometer side 202) of the device (e.g., the device 900) is not removed. Accordingly, the charging can be substantially reduced on the accelerometer side. Further, the SAM coating can be completely removed from the proof mass on the gyroscope side. This can eliminate the charging. Also, the SAM coating outgasses during eutectic-bonding and post bond anneal. Removing the SAM on the proof mass on the gyroscope side results in reduced gyroscope cavity pressure, which facilitates a better gyroscope cavity pressure stability.

The method 1000 can start, at 1002 with bonding first portions of a handle layer (e.g., the handle MEMS layer 206) to a first side of a device layer (e.g., the device layer 224). In some implementations, prior to bonding the first portions of the handle layer to the first side of the device layer, at least one cavity (e.g., the accelerometer cavity 212, the gyroscope cavity 214) can be formed in the handle layer.

At 1004, a bonding layer (e.g., the bonding layer 302) can be formed on a first portion of a second side of the device layer. A sacrificial layer (e.g., the sacrificial layer 402) can be formed, at 1006, on a second portion of the second side of the device layer. According to some implementations, the sacrificial layer can be etched to a first thickness that is less than a second thickness of the bonding layer. Thus, the sacrificial layer can be etched to be thinner than a thickness of the bonding layer.

Further, at 1008, an anti-stiction coating can be deposited on the device layer. For example, the anti-stiction coating can be a SAM coating (e.g., the SAM coating 602). At 1010, portions of the anti-stiction coating can be removed. Removal of the portions of the anti-stiction coating can result in a first remaining portion of the anti-stiction coating. The first remaining portion of the anti-stiction coating corresponds with (e.g., is complementary to) a location of a bump stop (e.g., the conductive bump stop 802) of the CMOS wafer.

Further, at 1012, the first portion of the second side of the device layer can be bonded to a Complementary Metal-Oxide-Semiconductor (CMOS) wafer. Further, in some implementations, prior to the bonding of the device layer and the CMOS wafer, an oxide layer can be formed in the handle layer. The bonding can comprise eutectically bonding the bonding layer to an aluminum layer on the CMOS wafer.

Figure 11:
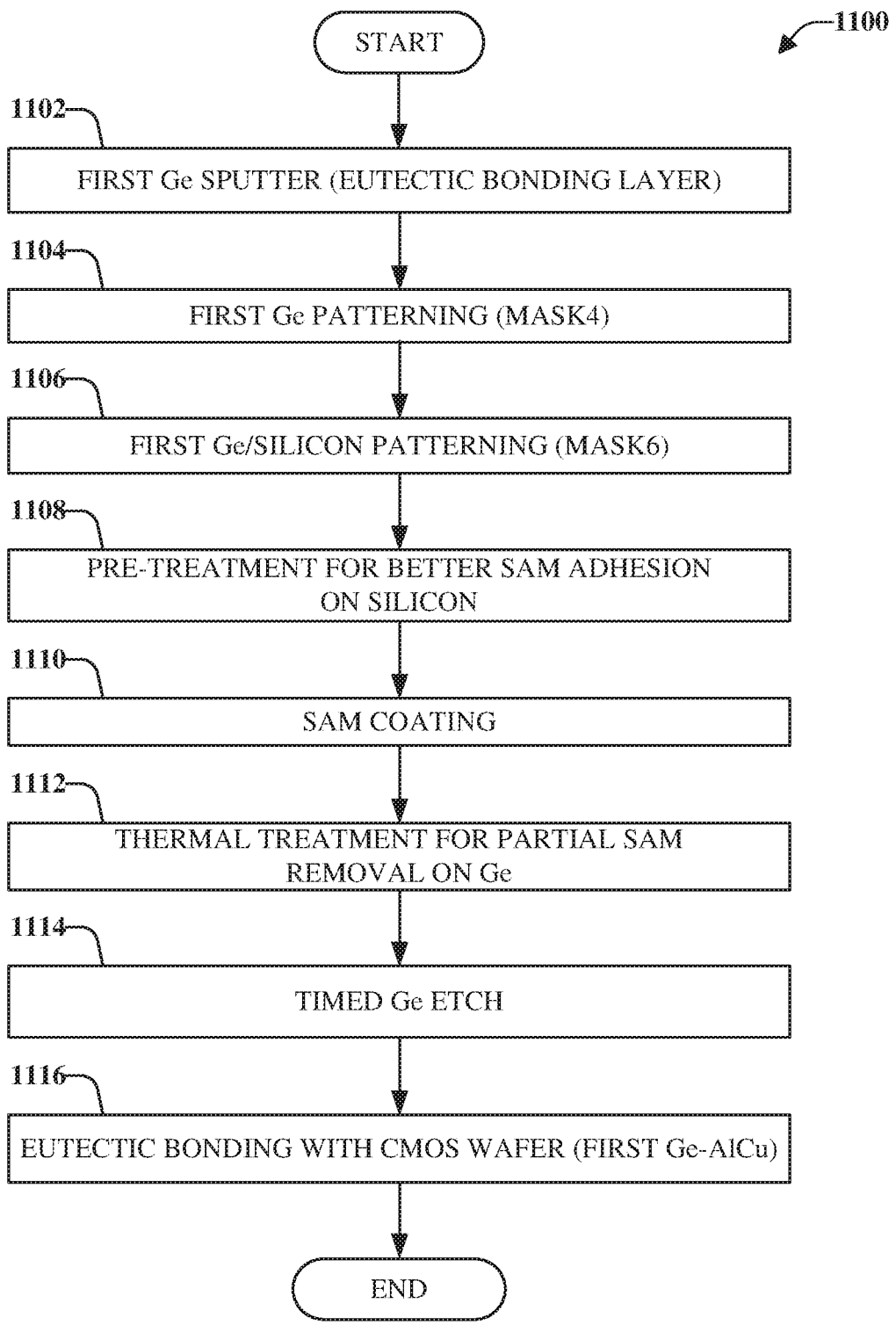
FIG. 11 illustrates a flow diagram of another example, non-limiting, method for fabricating a device in accordance with one or more embodiments described herein.

FIG. 11 illustrates a flow diagram of another example, non-limiting, method 1100 for fabricating a device in accordance with one or more embodiments described herein. Repetitive description of like elements employed in other embodiments described herein is omitted for sake of brevity.

The method 1100 starts, at 1102, when a first Ge layer (e.g., the bonding layer 302) is sputtered. The first Ge layer can be a eutectic bonding layer. At 1104, the first Ge layer can be patterned. For example, the pattering of the first Ge layer can include using Mask4 as discussed above.

At 1106, the first Ge layer and silicon (e.g., rough polysilicon 236 and the device layer 224) can be patterned using Mask6 as discussed above. At 1108, pre-treatment can be performed. The pre-treatment can enhance SAM deposition on the proof mass surface. Thus, the pre-treatment can provide a better SAM adhesion on silicon as compared to SAM adhesion without pre-treatment. According to some implementations, the pre-treatment can be similar to oxidation.

Further, at 1110, a SAM coating (e.g., the SAM coating 602) can be applied. The SAM coating can be applied to all exposed surfaces. Thermal treatment for partial SAM removal on the first Ge layer can be performed at 1112. The SAM coating has a different thermal stability than the Ge layer and the silicon. The thermal treatment can be in the range of around 300 to about 400 degrees Celsius, which can facilitate the selective removal of the SAM coating while maintaining a good SAM quality on the proof mass. Accordingly, it can be considered selective removal using the thermal treatment, leaving only a portion of the SAM coating (e.g., the remaining SAM portion 702).

Further, a timed Ge etch can be performed, at 1114, leaving only a portion of the SAM coating (e.g., the remaining SAM portion 702). At 1114, the first Ge layer can be slightly etched for removal of any residual SAM. Further, at 1116, eutectic bonding with the CMOS wafer is performed. The eutectic bonding can be a contact between the first Ge and the AlCu.

With the method 1100 of FIG. 11, accelerometer proof mass facing the CMOS bump stop (e.g., the conductive bump stop 802) can include Silicon-oxide-SAM coating (Si-oxide-SAM). Further, for the accelerometer proof mass (in other locations) can include Si-first Ge layer-oxide using method 1100. The gyroscope proof mass can include, using the method 1100, Si-first Ge layer-oxide.

Figure 12:
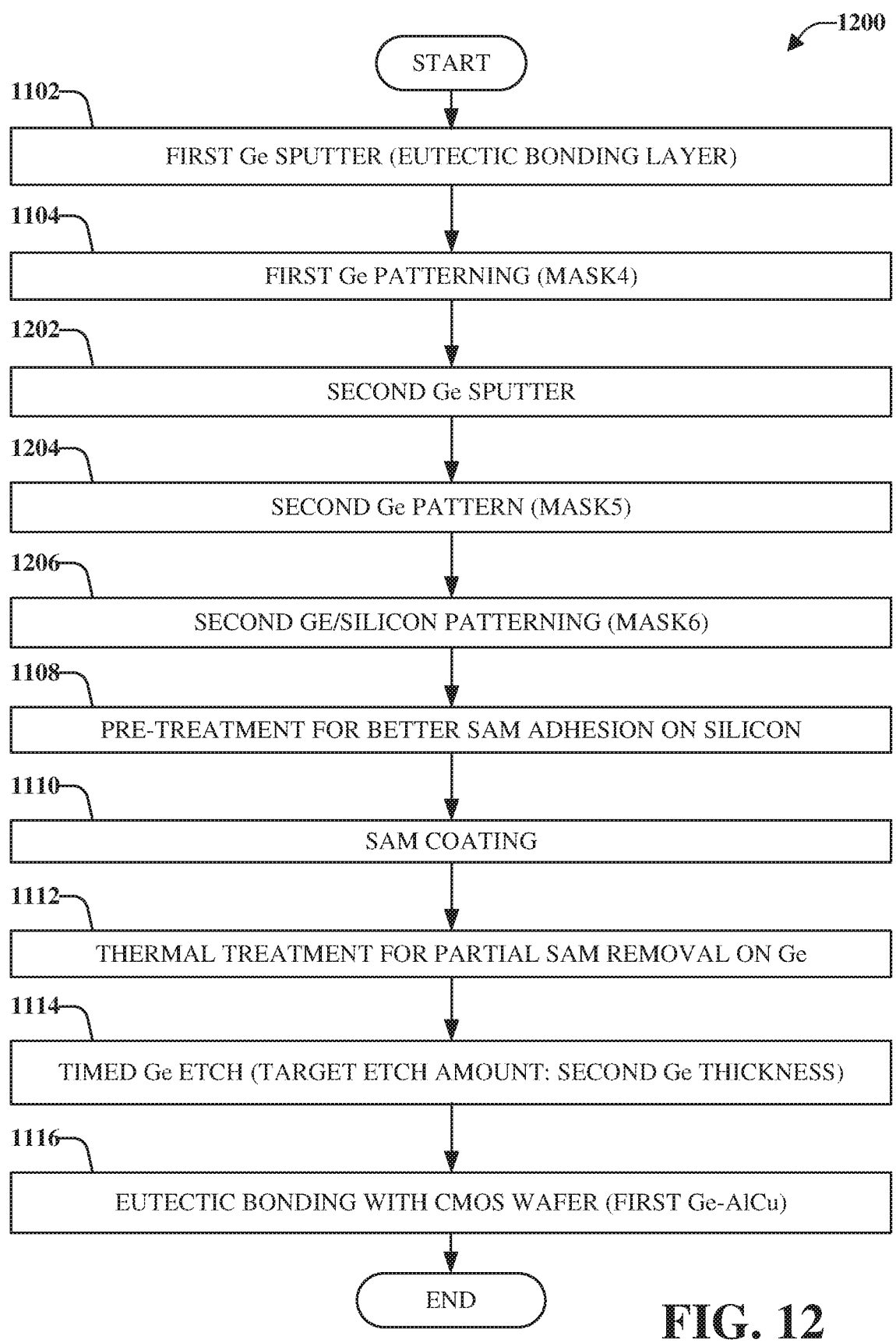
FIG. 12 illustrates a flow diagram of yet another example, non-limiting, method for fabricating a device in accordance with one or more embodiments described herein.

FIG. 12 illustrates a flow diagram of yet another example, non-limiting, method 1200 for fabricating a device in accordance with one or more embodiments described herein. Repetitive description of like elements employed in other embodiments described herein is omitted for sake of brevity.

The method 1200 of FIG. 12 is similar to the method 1100 of FIG. 11. However, for the method 1200, after the first Ge patterning, at 1104, a second Ge layer (e.g., the sacrificial layer 402) can be sputtered, at 1202. A thickness of the second Ge layer can be less than the thickness of the first Ge layer. At 1204, second Ge patterning can be performed (e.g., using Mask5). At 1206, patterning of the second Ge/silicon is performed (e.g., using Mask6). It is noted that for the method 1200, the first Ge/silicon is not patterned (e.g., step 1106 of FIG. 11). Further, for the timed Ge etch at 1114, the target etch amount is a thickness of the second Ge layer.

With the method 1200 of FIG. 12, the accelerometer proof mass facing the CMOS bump stop can include Si-oxide-SAM (similar to the device formed by the method 1100 of FIG. 11). The accelerometer proof mass (in other locations) can include Si-oxide, using method 1200. The gyroscope proof mass can include, using the method 1200, Si-oxide.

Figure 13:
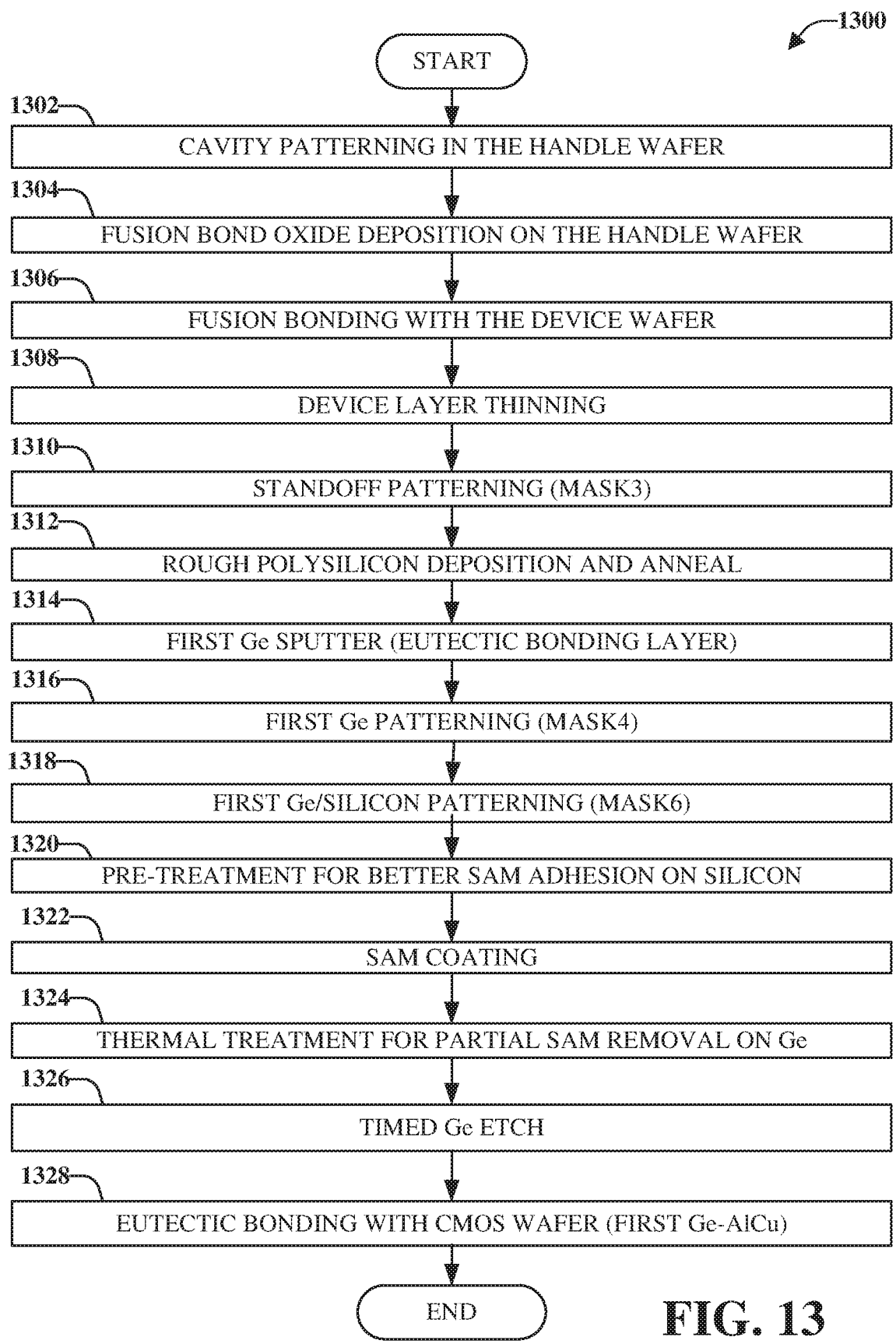
FIG. 13 illustrates a flow diagram of yet another example, non-limiting, method of a fuller process flow for fabricating a device in accordance with one or more embodiments described herein.

FIG. 13 illustrates a flow diagram of yet another example, non-limiting, method 1300 of a fuller process flow for fabricating a device in accordance with one or more embodiments described herein. Repetitive description of like elements employed in other embodiments described herein is omitted for sake of brevity.

At 1302, cavity patterning in the handle wafer (e.g., the handle MEMS layer 206) is performed. For example, the cavity patterning can include two masks, namely Mask1 and Mask2 (e.g., UCAV, USTOP). At 1304 fusion bond oxide (e.g., the insulating layer 220) is deposited on the handle wafer.

Fusion bonding with a device wafer (e.g., the device layer 224) is performed at 1306. Device layer thinning is performed at 1308. Standoff patterning (using Mask3) is performed at 1310.

Rough polysilicon (e.g., the rough polysilicon 236) is deposited and anneal of the rough polysilicon is performed at 1312. A first Ge layer (e.g., the bonding layer 302) can be sputtered (eutectic bonding layer), at 1314. The first Ge layer can be patterned (using Mask4), at 1316. Further, at 1318 the first Ge/silicon can be patterned (using Mask6). It is noted that a fifth mask is not referenced with respect to the method 1300 of FIG. 13.

At 1320, pre-treatment is performed, which can provide a better SAM adhesion on silicon as would be available without pre-treatment. At 1322, the SAM coating (e.g., the SAM coating 602) is applied. Thermal treatment for partial SAM removal on Ge is performed, at 1324, resulting in a remaining portion of the SAM coating (e.g., the remaining SAM portion 702). A timed Ge etch is performed at 1326 to slightly etch the first Ge layer for removal of residual SAM, if any is remaining. Thereafter, eutectic bonding with CMOS wafer (first Ge—AlCu) is performed at 1328.

With the method 1300 of FIG. 13, the accelerometer proof mass facing CMOS bump stop can include Si-oxide-SAM. Further, for the accelerometer proof mass (in other locations) can include Si-first Ge-oxide using method 1300. The gyroscope proof mass can include, using the method 1300, Si-first Ge-oxide.

Figure 14:
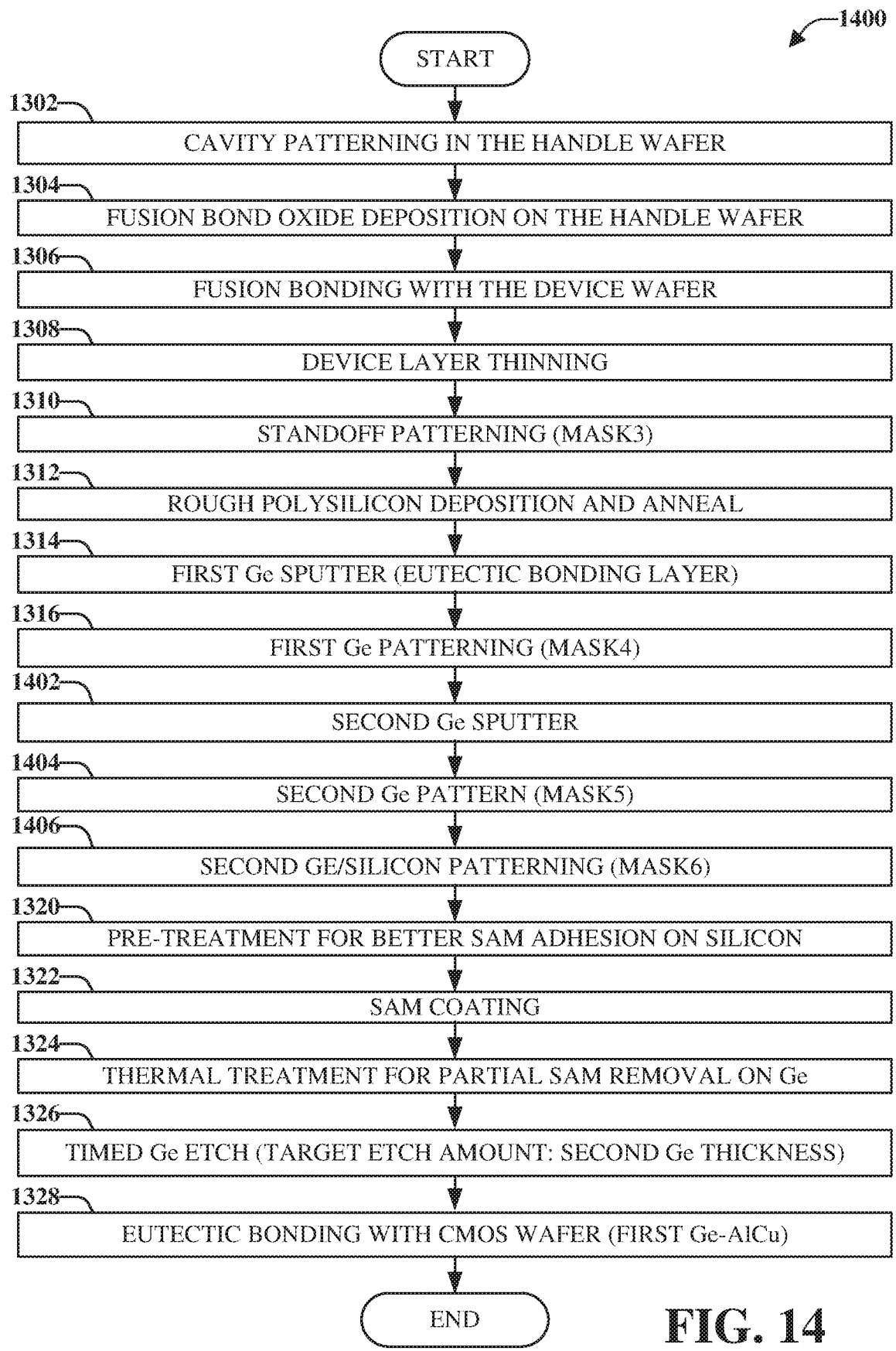
FIG. 14 illustrates a flow diagram of yet another example, non-limiting, method of another fuller process flow for fabricating a device in accordance with one or more embodiments described herein.

FIG. 14 illustrates a flow diagram of yet another example, non-limiting, method 1400 of another fuller process flow for fabricating a device in accordance with one or more embodiments described herein. Repetitive description of like elements employed in other embodiments described herein is omitted for sake of brevity.

The method 1400 of FIG. 14 is similar to the method 1300 of FIG. 13. However, for the method 1400, after the first Ge patterning, at 1316, a second Ge layer (e.g., the sacrificial layer 402) can be sputtered, at 1402. A thickness of the second Ge layer can be less than the thickness of the first Ge layer. At 1404, second Ge patterning can be performed (e.g., using Mask5). At 1406, patterning of the second Ge/silicon is performed (e.g., using Mask6). It is noted that for the method 1400, the first Ge/silicon is not patterned (e.g., step 1316 of FIG. 13). Further, for the timed Ge etch at 1326, the target etch amount is a thickness of the second Ge layer.

With the method 1400 of FIG. 14, the accelerometer proof mass facing CMOS bump stop can include Si-oxide-SAM (similar to the device formed by the method 1300 of FIG. 13). Further, for the accelerometer proof mass (in other locations) can include Si-oxide, using method 1400. The gyroscope proof mass can include, using the method 1400, Si-oxide.

Reference throughout this specification to "one embodiment," or "an embodiment," means that a particular feature, structure, or characteristic described in connection with the embodiment is included in at least one embodiment. Thus, the appearances of the phrase "in one embodiment," "in one aspect," or "in an embodiment," in various places throughout this specification are not necessarily all referring to the same embodiment. Furthermore, the particular features, structures, or characteristics can be combined in any suitable manner in one or more embodiments.

In addition, the words "example" and "exemplary" are used herein to mean serving as an instance or illustration. Any embodiment or design described herein as "example" or "exemplary" is not necessarily to be construed as preferred or advantageous over other embodiments or designs. Rather, use of the word example or exemplary is intended to present concepts in a concrete fashion. As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an"

as used in this application and the appended claims should generally be construed to mean "one or more" unless specified otherwise or clear from context to be directed to a singular form.

In addition, the various embodiments can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, machine-readable device, computer-readable carrier, computer-readable media, machine-readable media, computer-readable (or machine-readable) storage/communication media. For example, computer-readable media can comprise, but are not limited to, a magnetic storage device, e.g., hard disk; floppy disk; magnetic strip(s); an optical disk (e.g., compact disk (CD), a digital video disc (DVD), a Blu-ray Disc™ (BD)); a smart card; a flash memory device (e.g., card, stick, key drive); and/or a virtual device that emulates a storage device and/or any of the above computer-readable media. Of course, those skilled in the art will recognize many modifications can be made to this configuration without departing from the scope or spirit of the various embodiments The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the subject matter has been described herein in connection with various embodiments and corresponding figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method of fabricating a sensor device, comprising:
    bonding first portions of a handle layer to a first side of a device layer;
    depositing rough polysilicon over and adjacent a second side of the device layer;
    forming a bonding layer on a first portion of the second side of the device layer;
    forming a sacrificial layer on a second portion of the second side of the device layer;
    etching the device layer;
    after the etching of the device layer, depositing an anti-stiction coating on the device layer, over the sacrificial layer, and over the rough polysilicon;
    removing portions of the anti-stiction coating deposited over of the sacrificial layer and removing the sacrificial layer, resulting in a first remaining portion of the anti-stiction coating that faces a bump stop; and
    after the removing of the portions of the anti-stiction coating, bonding the first portion of the second side of the device layer to a Complementary Metal-Oxide-Semiconductor (CMOS) wafer.

2. The method of claim 1, wherein the first remaining portion of the anti-stiction coating corresponds with a location of a bump stop of the CMOS wafer.

3. The method of claim 1, wherein the anti-stiction coating is a Self-Assembled Monolayer (SAM) coating.

4. The method of claim 1, further comprising:
    prior to the depositing the anti-stiction coating, etching the sacrificial layer to be thinner than a thickness of the bonding layer.

5. The method of claim 1, further comprising:
    prior to the bonding first portions of the handle layer to a first side of the device layer, forming at least one cavity in the handle layer.

6. The method of claim 5, further comprising:
    forming an oxide layer in the handle layer prior to the bonding the first portion of the second side of the device layer.

7. The method of claim 1, wherein the bonding comprises eutectically bonding a germanium layer or an aluminum layer of the bonding layer to an aluminum layer or a germanium layer on the CMOS wafer.

* * * * *